United States Patent
Haynie

(10) Patent No.: US 6,890,826 B2
(45) Date of Patent: May 10, 2005

(54) METHOD OF MAKING BIPOLAR TRANSISTOR WITH INTEGRATED BASE CONTACT AND FIELD PLATE

(75) Inventor: Sheldon Douglas Haynie, Amherst, NH (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/226,765

(22) Filed: Aug. 23, 2002

(65) Prior Publication Data

US 2004/0036145 A1 Feb. 26, 2004

(51) Int. Cl.[7] ..................... H01L 27/082; H01L 27/102
(52) U.S. Cl. .................. 438/309; 438/329; 438/331; 438/336; 438/377; 257/583; 257/584; 257/587; 257/588
(58) Field of Search ............................... 438/309, 336, 438/377, 329–332, 313, 322; 257/583–584, 587, 588, 556, 557, 565

(56) References Cited

U.S. PATENT DOCUMENTS 5,939,738 A   8/1999  Morris .................. 257/197

OTHER PUBLICATIONS

Maida, Mike, "High–Speed Amplifiers Utilize New Complementary Bipolar Process," http://www.nikkeibp.asiabiztech.com/nea/200112/inst_157740.html, (Dec. 2001).

*Primary Examiner*—Donghee Kang
(74) *Attorney, Agent, or Firm*—W. Daniel Swayze, Jr.; W. James Brady; Frederick J. Telecky, Jr.

(57) ABSTRACT

A method of manufacturing a bipolar junction transistor results in an integrated polysilicon base contact and field plate element minimally spaced from a polysilicon emitter contact by using a single mask to define respective openings for these elements. In particular, a dielectric layer is deposited on a semiconductor wafer and has two openings defined by a single masking step, one opening above an emitter region and a second opening above a base-collector junction region. Polysilicon is deposited on the dielectric layer and selectively doped in the areas of the openings. Thus for an NPN transistor for example, the area above the emitter opening is doped N type and the area above the base/field plate opening is doped P type. The doped polysilicon is patterned and etched to leave a polysilicon emitter contact and an integrated polysilicon base contact and field plate within the respective openings. Metal contacts are then deposited on the polysilicon emitter contact and integrated base contact and field plate.

3 Claims, 5 Drawing Sheets

METHOD OF MAKING BIPOLAR TRANSISTOR WITH INTEGRATED BASE CONTACT AND FIELD PLATE

CROSS REFERENCE TO RELATED APPLICATIONS

None

STATEMENT REGARDING FEDERALLY SPONSORED RESEARCH OR DEVELOPMENT

Not Applicable

BACKGROUND OF THE INVENTION

The present invention relates to the field of semiconductor manufacturing, and more specifically to the manufacturing of bipolar junction transistors.

In a widely used layout for bipolar junction transistors, a base diffusion region is formed in a larger area of doped semiconductor that forms a collector region, and a smaller emitter region is formed within the base region at the surface of the semiconductor wafer. The majority of device current travels vertically through the base region between the emitter and collector regions. Electrical contacts to the base and collector are formed at lateral areas of the transistor.

In transistors of the above type used in high-voltage applications, a limiting factor is the transistor's "breakdown voltage", which is the voltage at which uncontrolled amounts of current are conducted at reverse-biased junctions. One specific area at which breakdown occurs is at the portion of the base-collector junction adjacent to the surface of the semiconductor wafer, owing to high electric field gradients that typically exist at such points. If a transistor is to have a higher breakdown voltage so as to be safely usable at higher operating voltages, then steps must be taken to either reduce field gradients in this region or to somehow improve the region's ability to withstand high field gradients.

One technique that has been used to favorably shape the electric field in the surface region of the base-collector junction is to place a biased conductive element above this region, for example on top of an oxide or similar dielectric layer. Such an element is commonly referred to as a "field plate". The bias charge on the field plate interacts with charge existing in nearby elements of the device (such as the areas of the base and collector immediately adjacent the base-collector junction) to reduce the field gradient in this surface junction area. As a result, the device can be operated safely at higher voltages than would otherwise be possible.

Another important aspect of the layout of bipolar junction transistors is the placing of contacts to the base and emitter, because these can affect the size of the device and therefore the cost of the device as well. In one current manufacturing technique, the emitter contact is made using a doped polysilicon element in contact with the emitter diffusion, while the base contact is made using a traditional "ohmic" connection with metal in contact with the base diffusion region. These different contacts are formed using separate masking steps. This requires that the contacts be sufficiently spaced to allow for mask alignment tolerance during manufacturing, contributing to overall device size. This problem is compounded when a traditional field plate requiring its own separate masking is employed.

It would be desirable to manufacture a bipolar junction transistor that exhibits high breakdown voltage while being as small as possible for a given manufacturing technology, thereby improving device performance and cost.

BRIEF SUMMARY OF THE INVENTION

In accordance with the present invention, a method of manufacturing bipolar junction transistors is disclosed that provides a field plate for improved breakdown voltage, while reducing the area needed for the emitter, base and field plate contact elements. In one aspect, the method results in a transistor having an integrated base contact and field plate element which is smaller than the separate base contact and field plate of the prior art, and generally more effective at reducing field gradients in the surface portion of the base-collector junction. Additionally, the emitter contact and integrated base contact/field plate are made using a single mask to define respective openings in which the contacts are formed, further reducing device size by eliminating mask alignment tolerance from the contact spacing requirements.

In the disclosed method, a dielectric layer is deposited on a partially-processed semiconductor wafer having a collector region, a base region within the collector region so as to define a base-collector junction, and an emitter region within the base region. The dielectric layer has two openings defined by a single masking step, a first opening being formed above the emitter region and the second opening being formed above the base-collector junction. Polysilicon is deposited on the dielectric layer including the areas in which the openings are formed, and the polysilicon is selectively doped in the areas of the openings to create respective doped areas of polysilicon. For an NPN transistor, the area above the emitter opening is doped N type and the area above the base/field plate opening is doped P type; these doping polarities are reversed for a PNP transistor.

The doped polysilicon is then patterned and etched to leave a polysilicon emitter contact and an integrated polysilicon base contact and field plate within the respective openings. Respective metal contacts are deposited on the polysilicon emitter contact and integrated base contact and field plate.

Other aspects, features, and advantages of the present invention will be apparent from the detailed description that follows.

BRIEF DESCRIPTION OF THE SEVERAL VIEWS OF THE DRAWING

The invention will be more fully understood by reference to the following Detailed Description of the Invention in conjunction with the Drawing, of which.

DETAILED DESCRIPTION OF THE INVENTION

Figure 1:
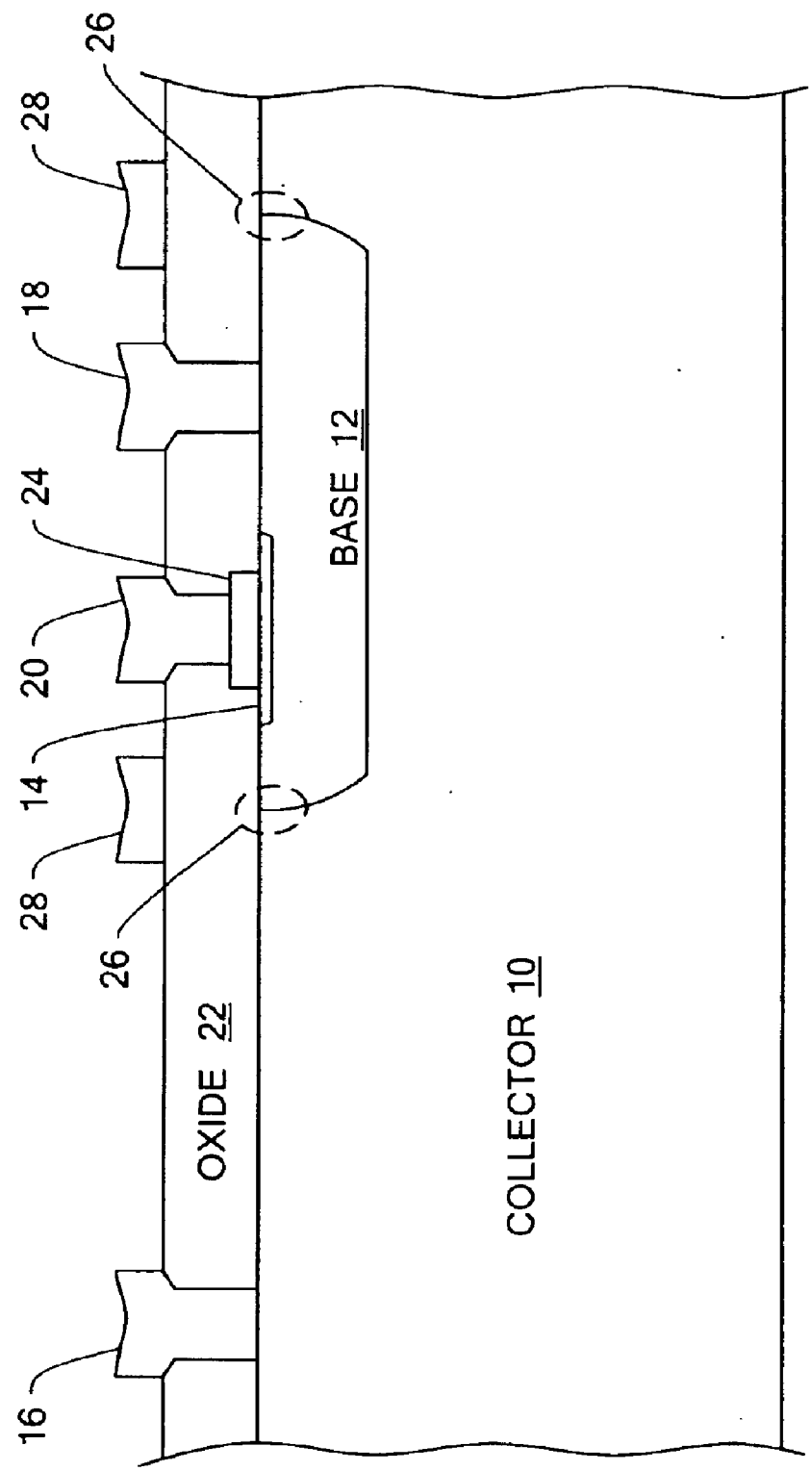
FIG. 1 is a schematic vertical view of a bipolar transistor as known in the art.

In FIG. 1, a prior art bipolar transistor is shown as including a collector region 10, base region 12 and emitter region 14, arranged in vertical relationship to each other, and respective collector, base and emitter metallizations 16, 18 and 20. The metallizations 16, 18 and 20 are typically formed by deposition of metal over a selectively-etched oxide layer 22. The collector and base metallizations 16 and 18 contact respective surface portions of the collector and base regions 10 and 12, forming so-called "ohmic" contacts. The contact to the emitter region 14 includes a doped polysilicon (or "poly") emitter contact 24 disposed on a surface portion of the emitter region 14 and contacted by the emitter metallization 20.

Figure 2:
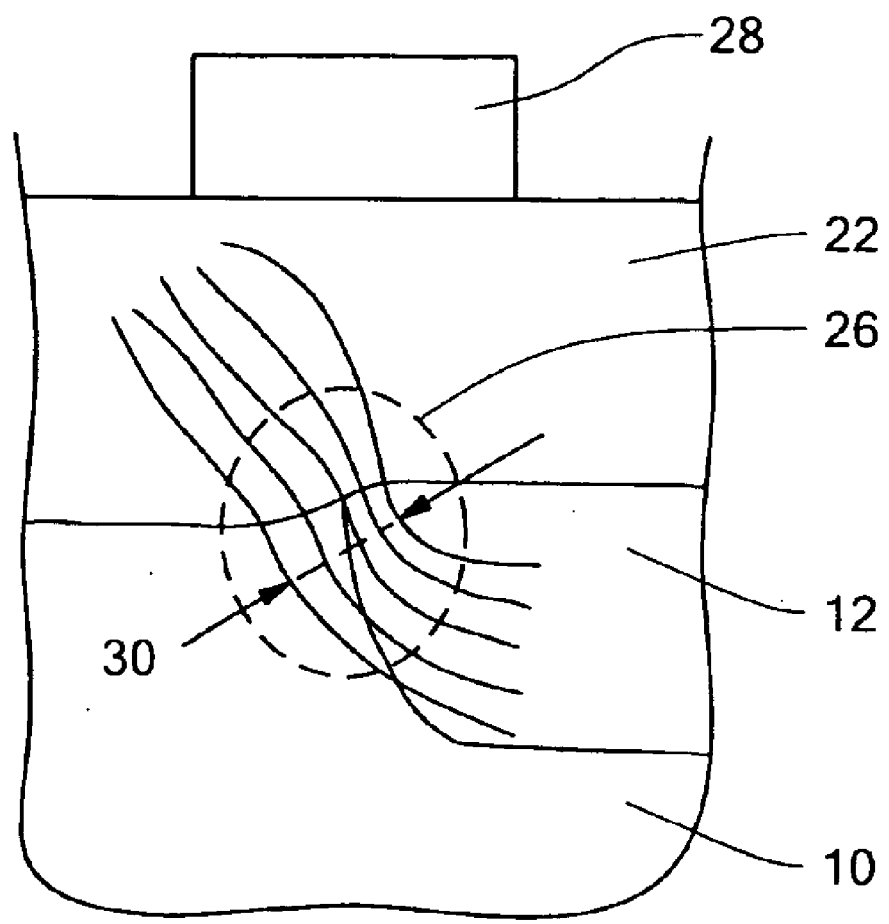
FIG. 2 is a diagram depicting an electric field in a region of the bipolar transistor of FIG. 1.

As discussed above, prior art bipolar transistors such as that of FIG. 1 generally experience breakdown at high operating voltages due to locally high field gradients at the upper lateral portions 26 of the base-collector junction. To address this problem, it has been known to employ a conductive field plate 28 on the oxide layer 22 above the lateral portions 26. In operation, the field plate 28 is biased at an appropriate level to reduce the electric field gradients in the regions 26. For example, the field plate 28 may be biased at the same voltage as is applied to the base contact 20. The result of this action is shown generally in FIG. 2. The field lines are shown crossing from the oxide 22 into the base 12 and/or collector 10. In the illustrated embodiment, the field lines represent field strength intervals of 10 volts. As shown, there is a gradient of approximately 40 volts along a line 30 in a small area surrounding the upper lateral portion 26 of the base-collector junction.

Figure 3:
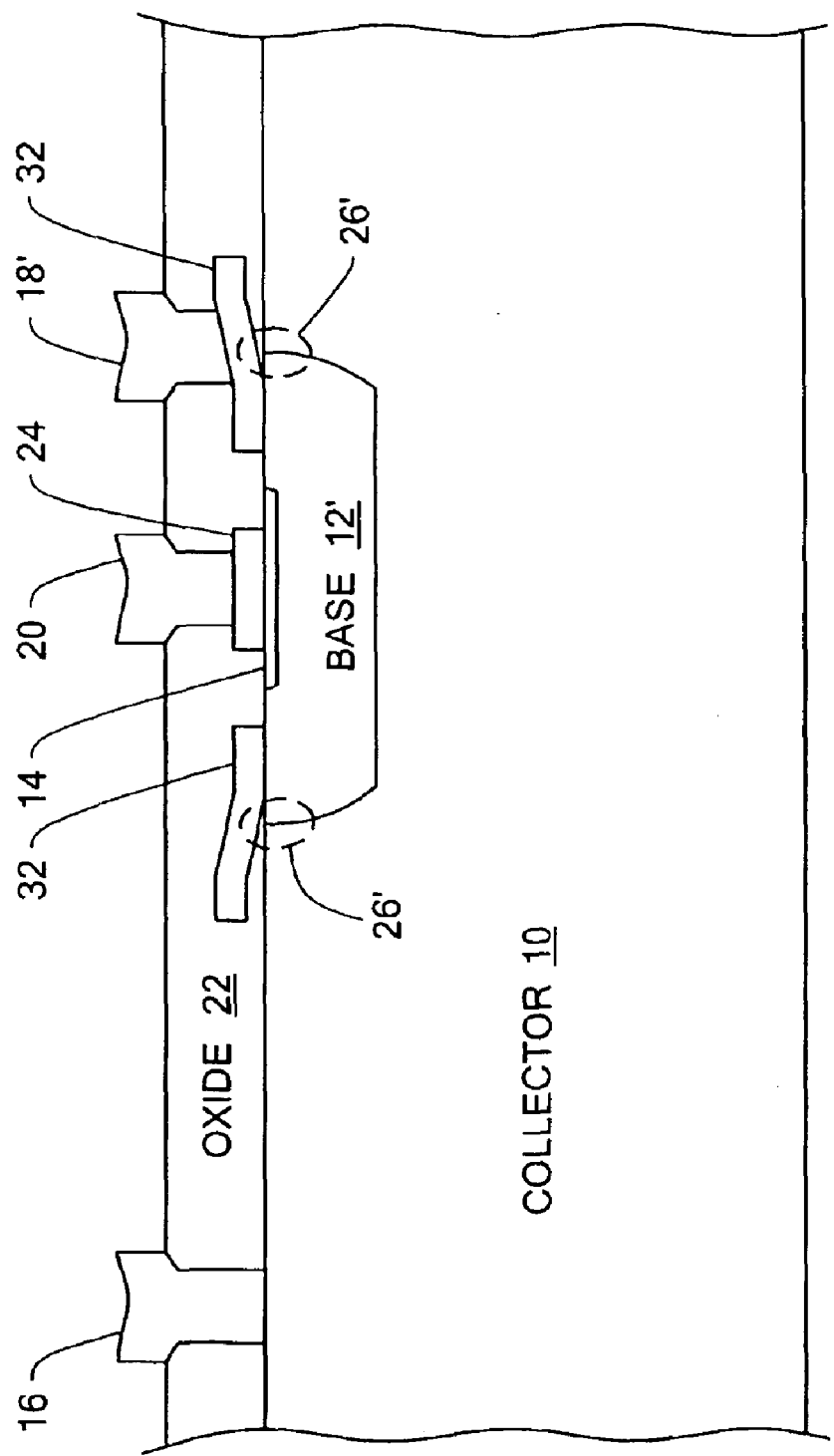
FIG. 3 is a schematic vertical view of a bipolar transistor in accordance with the present invention.

FIG. 3 shows an improved bipolar transistor in which the field plate 32 is made of doped polysilicon and disposed much closer vertically to the lateral area 26' of the base-collector junction. The closer spacing results in more effective modification of the field in the region 26', so that breakdown voltage is increased beyond that achieved in the prior art transistor of FIG. 1. The field plate 32 is preferably disposed around the planar periphery of the transistor along the lateral portion 26' of the base-collector junction. Additionally, the field plate 32 serves as a contact to the base region 12, along with a metal contact 18' extending through the oxide 22. It will be observed that the transistor of FIG. 3 is generally more compact in the horizontal dimension than the transistor of FIG. 1, owing to the merging of the field plate and base contact into a single structure 32. The smaller device size reduces capacitance and allows higher frequency operation.

Figure 4:
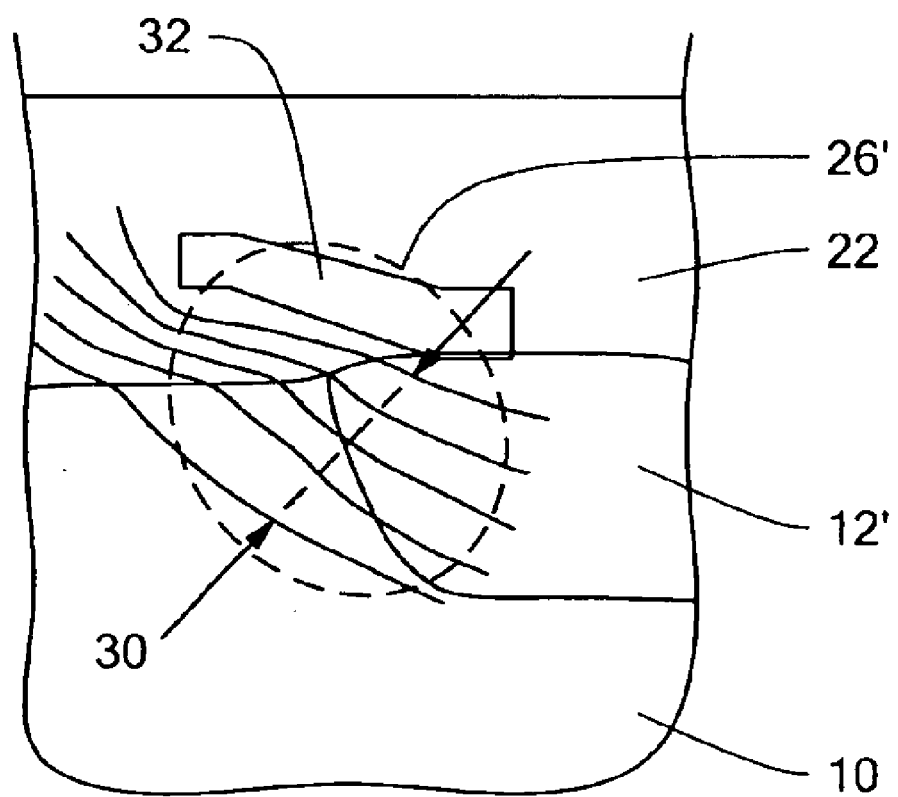
FIG. 4 is a diagram depicting an electric field in a region of the bipolar transistor of FIG. 3.

FIG. 4 shows generally the improved field distribution in the lateral region 26' of the base-collector junction that is achieved by the transistor of FIG. 3. Specifically, it will be observed that the 40-volt gradient along line 30 in FIG. 4 is less than the same gradient in FIG. 2. For a given manufacturing process, then, it will generally be possible to operate the transistor of FIG. 3 at higher voltages without causing breakdown than is possible for the transistor of FIG. 1.

Figure 5:
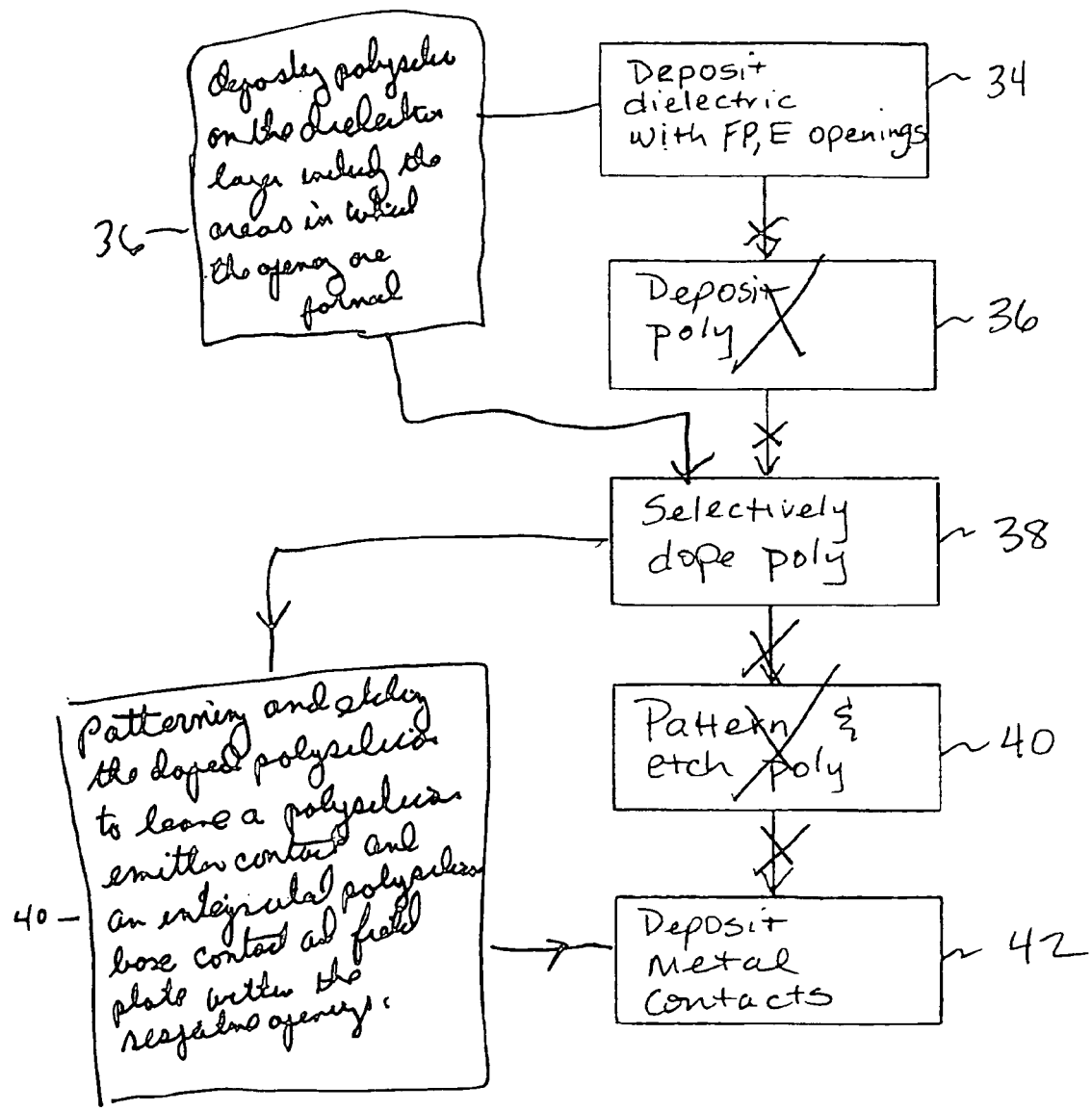
FIG. 5 is a flow diagram of a portion of a process for making the bipolar transistor of FIG. 4 in accordance with the present invention.

FIG. 5 shows the pertinent part of a process of making the transistor of FIG. 4, specifically the part of the process responsible for formation of the poly emitter 24, the field plate 32, and the contacts 18' and 20. In step 34, a dielectric layer such as oxide layer 22 is formed, along with respective openings for the poly field plate 32 and poly emitter 24. At step 36, polysilicon is deposited on this dielectric layer. At step 38, the polysilicon is selectively doped in the regions of the emitter 24 and field plate 32, the doping polarity being determined by whether the transistor is an NPN or PNP transistor. For an NPN transistor, the emitter 24 is doped negative while the field plate 32 is doped positive, and for a PNP transistor this doping pattern is reversed. After the doping, the polysilicon is patterned and etched at step 40 to remove all the deposited poly except that forming the poly emitter 24 and poly field plate 32. Thereafter, the metal contacts 18' and 20 are deposited at step 42.

One significant aspect of the procedure of FIG. 5 is the use of a single mask to define the openings for both the poly emitter 24 and the field plate/base contact 32, and the subsequent definition of these separate elements by selective doping and etching. The use of a single mask enables closer spacing of these elements than is generally possible using separate masks, due to the elimination of alignment tolerance. This closer spacing, coupled with the integration of the base contact with the field plate, makes for a generally smaller device, while simultaneously providing for higher breakdown voltages due to the increased effectiveness of the field plate 32.

It will be apparent to those skilled in the art that modifications to and variations of the disclosed methods and apparatus are possible without departing from the inventive concepts disclosed herein, and therefore the invention should not be viewed as limited except to the full scope and spirit of the appended claims.

What is claimed is:

1. A method of making a bipolar junction transistor, comprising:

depositing a dielectric layer on a partially-processed semiconductor wafer having a collector region, a base region within the collector region so as to define a base-collector junction, and an emitter region within the base region, the dielectric layer having two openings defined by a single masking step, a first opening being formed above the emitter region and the second opening being formed above the base-collector junction;

depositing polysilicon where the openings are formed;

selectively doping the polysilicon in the areas of the openings to create respective doped areas of polysilicon;

patterning and etching the doped polysilicon to leave a polysilicon emitter contact and an integrated polysilicon base contact/field plate within the respective openings; and depositing respective metal contacts on the emitter contact and integrated base contact/field plate.

2. A method according to claim 1, wherein the bipolar junction transistor is an NPN type transistor, and wherein selectively doping comprises doping the area above the first opening N type and the area above the second opening P type.

3. A method according to claim 1, wherein the bipolar junction transistor is a PNP type transistor, and wherein selectively doping comprises doping the area above the first opening P type and the area above the second opening N type.

* * * * *